(12) United States Patent
Song et al.

(10) Patent No.: US 8,922,251 B2
(45) Date of Patent: Dec. 30, 2014

(54) BUFFER CONTROL CIRCUIT AND INTEGRATED CIRCUIT INCLUDING THE SAME

(75) Inventors: Taek-Sang Song, Gyeonggi-do (KR); Dae-Han Kwon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 605 days.

(21) Appl. No.: 13/333,983

(22) Filed: Dec. 21, 2011

(65) Prior Publication Data
US 2012/0262323 A1 Oct. 18, 2012

(30) Foreign Application Priority Data
Apr. 12, 2011 (KR) .......................... 10-2011-0033683

(51) Int. Cl.
*H03B 1/00* (2006.01)
*H03K 3/00* (2006.01)
*H03K 5/24* (2006.01)
*H03K 19/00* (2006.01)
*H03K 19/0948* (2006.01)

(52) U.S. Cl.
CPC .......... *H03K 5/2481* (2013.01); *H03K 19/0027* (2013.01); *H03K 19/0948* (2013.01)
USPC ........... 327/108; 327/109; 327/110; 327/111; 327/112

(58) Field of Classification Search
USPC ................................................ 327/108–112
See application file for complete search history.

(56) References Cited

U.S. PATENT DOCUMENTS

| | | | |
|---|---|---|---|
| 6,803,792 B2 | 10/2004 | Yasuda et al. | |
| 7,557,620 B2 | 7/2009 | Pan | |
| 7,609,097 B2* | 10/2009 | Leonowich et al. | 327/108 |
| 7,782,078 B2* | 8/2010 | Koo | 326/30 |
| 8,723,712 B1* | 5/2014 | Kabir et al. | 341/144 |
| 2013/0169317 A1* | 7/2013 | Kim | 327/108 |
| 2014/0062582 A1* | 3/2014 | Hammerschmidt | 327/538 |
| 2014/0146922 A1* | 5/2014 | Nazemi et al. | 375/316 |
| 2014/0176196 A1* | 6/2014 | Li et al. | 327/108 |

FOREIGN PATENT DOCUMENTS

| | | |
|---|---|---|
| KR | 1019990017139 | 3/1999 |
| KR | 1020000074284 | 12/2000 |
| KR | 100893593 | 4/2009 |

OTHER PUBLICATIONS

Office Action issued by the Korean Intellectual Property Office on Sep. 21, 2012.
Notice of Allowance issued by the Korean Intellectual Property Office on May 20, 2013.

* cited by examiner

*Primary Examiner* — Adam Houston
(74) *Attorney, Agent, or Firm* — IP & T Group LLP

(57) ABSTRACT

A buffer control circuit includes a current supply unit configured to supply current and adjust the current in response to codes, an amplifying buffer configured to operate using the current and output a value obtained by comparing a reference potential and the reference potential, a second buffer configured to buffer an output of the first buffer, and a code generation unit configured to generate the codes in response to an output of the second buffer.

27 Claims, 11 Drawing Sheets

BUFFER CONTROL CIRCUIT AND INTEGRATED CIRCUIT INCLUDING THE SAME

CROSS-REFERENCE TO RELATED APPLICATIONS

The present application claims priority of Korean Patent Application No. 10-2011-0033683, filed on Apr. 12, 2011, which is incorporated herein by reference in its entirety.

BACKGROUND

1. Field

Exemplary embodiments of the present invention relate to a buffer control circuit, and more particularly, to a technology for controlling a buffer to accurately recognize the logic level of an input signal.

2. Description of the Related Art

As the data transmission speeds of various integrated circuits rapidly increase, high speed and high quality buffers are useful. In particular a buffer capable of correctly receiving a signal distorted due to inter-symbol interference or crosstalk is being developed.

FIG. 1 is a configuration diagram of a conventional buffer circuit.

Referring to FIG. 1, the buffer circuit includes a current supply unit 110, an amplifier type buffer 120 and an inverter type buffer 130.

The current supply unit 110 supplies current to be used by the amplifier type buffer 120. The current supply unit 110 may be configured by a current source well-known in the art.

The amplifier type buffer 120 is configured as a differential amplifier. The amplifier type buffer 120 compares an input signal VIN and a reference potential VREF and drives an output terminal V1 according to a comparison result. If the level of the input signal VIN is higher than the reference potential VREF, the output terminal V1 is driven to a high level, and if the level of the input signal VIN is lower than the reference potential VREF, the output terminal V1 is driven to a low level.

The inverter type buffer 130 receives and outputs a signal from the output terminal V1 of the amplifier type buffer 120. The inverter type buffer 130 is a buffer constituted by a logic gate, such as an inverter, a NAND gate, a NOR gate, and the like, which is placed at a rear end of the amplifier type buffer 120 in the buffer circuit. It is illustrated in the drawing that the inverter type buffer 130 includes two inverters.

FIGS. 2 and 3 are graphs showing the voltage levels of an output terminal V1 and an output terminal V2 in an ideal case and in a non-ideal case.

Referring to FIG. 2, the crossing point of the signal of the output terminal V1 and the signal of an output terminal V2 is the same as a reference potential VREF. In this case, when the input signal VIN is the same as the reference potential VREF, since the signal of the output terminal V1 and the signal of the output terminal V2 are at the reference potential VREF, the logic value of the input signal VIN may be accurately recognized.

Referring to FIG. 3, the crossing point of the signal of the output terminal V1 and the signal of the output terminal V2 is not the reference potential VREF. This is caused due to the fact that the logic threshold of the inverter is different from the reference potential VREF. The degree of significance of this phenomenon may vary according to a PVT variation of an integrated chip including the buffer circuit. In the case where the crossing point of the signal of the output terminal V1 and the signal of the output terminal V2 is not the reference potential VREF as shown in FIG. 3, when the input signal VIN has a high level, the input signal VIN may be erroneously recognized as a low level inside a chip, and when the input signal VIN has a low level, the input signal VIN may be erroneously recognized as a high level. In particular, where the input signal VIN is a periodic wave such as a clock, the duty of the periodic wave may be distorted.

SUMMARY

An embodiment of the present invention is to allow a buffer circuit to detect accurately the logic level of an input signal.

In accordance with an embodiment of the present invention, a buffer control circuit may include: a current supply unit configured to supply current and adjust the current in response to codes; a first buffer configured to receive the current and output a value obtained by comparing a reference potential received at one input node to the reference potential received at another input node; a second buffer configured to buffer an output of the first buffer; and a code generation unit configured to generate the codes in response to an output of the second buffer.

In accordance with another embodiment of the present invention, a buffer control circuit may include: a first buffer configured to output a value obtained by comparing a reference potential received at one input node to the reference potential received at another input node; a current sinking unit configured to sink current and adjust the current in response to codes; a second buffer configured to buffer an output of the first buffer; and a code generation unit configured to generate the codes in response to an output of the second buffer.

In accordance with another embodiment of the present invention, a buffer control circuit may include: a current supply unit configured to supply a supply current and adjust the supply current in response to first codes; a first amplifying buffer configured to receive the supply current and drive an output node by comparing received at one input node a reference potential to the reference potential received at another input node; a second amplifying buffer configured to drive the output node by comparing the reference potential received at one input node to the reference potential received at another input node; a current sinking unit configured to sink a sinking current and adjust the sinking current in response to second codes; an additional buffer configured to buffer a signal outputted from the output node; and a code generation unit configured to generate the first codes and the second codes in response to an output of the additional buffer.

In accordance with another embodiment of the present invention, an integrated circuit may include: a replica current supply unit configured to supply current and adjust the current in response to codes; a replica amplifying buffer configured to receive the current supplied from the replica current supply unit and output a value obtained by comparing a reference potential received at one input node to the reference potential received at another input node; an additional buffer configured to buffer an output of the replica amplifying buffer; a code generation unit configured to generate the codes in response to an output of the additional buffer; at least one input pad; at least one current supply unit configured to supply current in response to the codes; and at least one amplifying buffer configured to receive the current supplied from the current supply unit and compare a signal inputted to the at least one input pad and the reference potential.

In accordance with yet another embodiment of the present invention, an integrated circuit may include: a replica amplifying buffer configured to compare a reference potential received at one input node to the reference potential received at another input node; a replica current sinking unit configured to sink a current and adjust the current in response to codes; an additional buffer configured to buffer an output of the replica amplifying buffer; a code generation unit configured to generate the codes in response to an output of the additional buffer; at least one input pad; at least one current supply unit configured to supply current in response to the codes; and at least one amplifying buffer configured to receive the current supplied from the current supply unit and compare a signal inputted to the at least one input pad and the reference potential.

In accordance with still another embodiment of the present invention, an integrated circuit may include: a replica current supply unit configured to supply a supply current and adjust the supply current in response to first codes; a first replica amplifying buffer configured to receive the supply current supplied from the replica current supply unit and drive an output node by comparing a reference potential received at one input node to the reference potential at another input node; a second replica amplifying buffer configured to drive the output node by comparing the reference potential received at one input node to the reference potential received at another input node; a replica current sinking unit configured to sink a sinking current and adjust the sink current in response to second codes; a replica additional buffer configured to buffer a signal outputted from the output node; a code generation unit configured to generate the first codes and the second codes in response to an output of the replica additional buffer; at least one input pad; at least one current supply unit configured to supply current in response to the first codes; at least one first amplifying buffer configured to receive the current supplied from the at least one current supply unit and drive an output node by comparing a signal inputted to the at least one input pad and the reference potential; at least one second amplifying buffer configured to drive the output node by comparing the signal inputted to the at least one input pad and the reference potential; and at least one current sinking unit configured to sink current from the at least one second amplifying buffer in response to the second codes.

DETAILED DESCRIPTION

Figure 1:
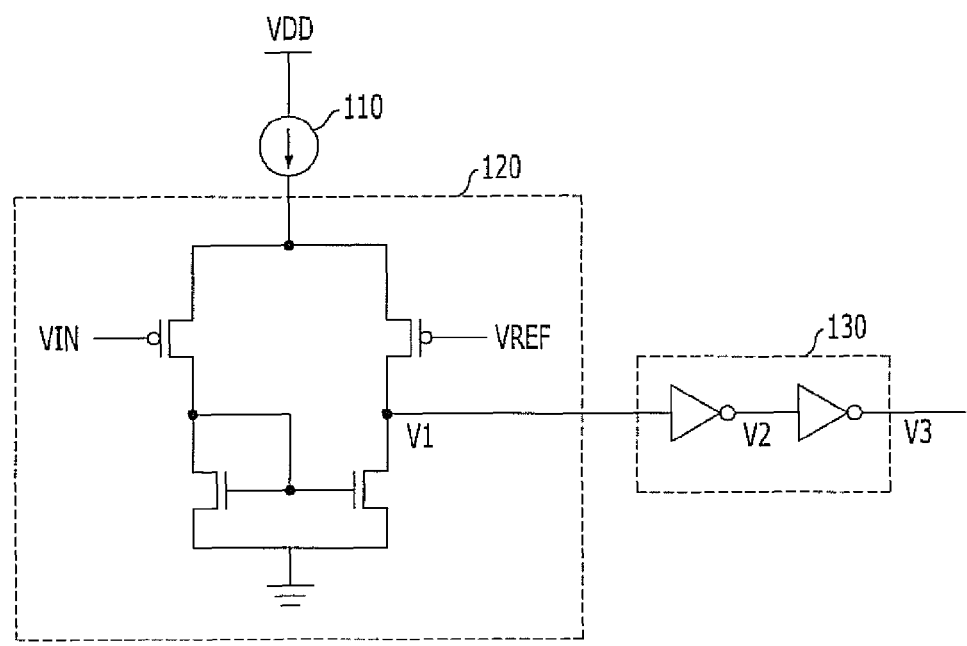
FIG. 1 is a configuration diagram of a conventional buffer circuit.
Figure 2:
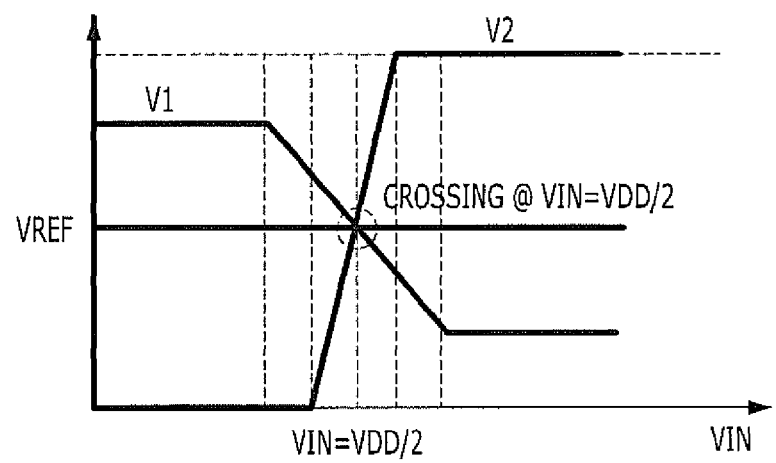
FIGS. 2 and 3 are graphs showing the voltage levels of output terminals in an ideal case and in a non-ideal case.
Figure 3:
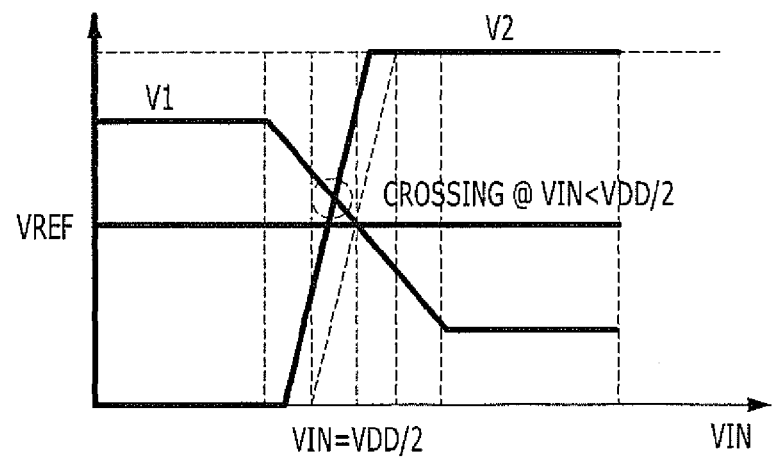

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
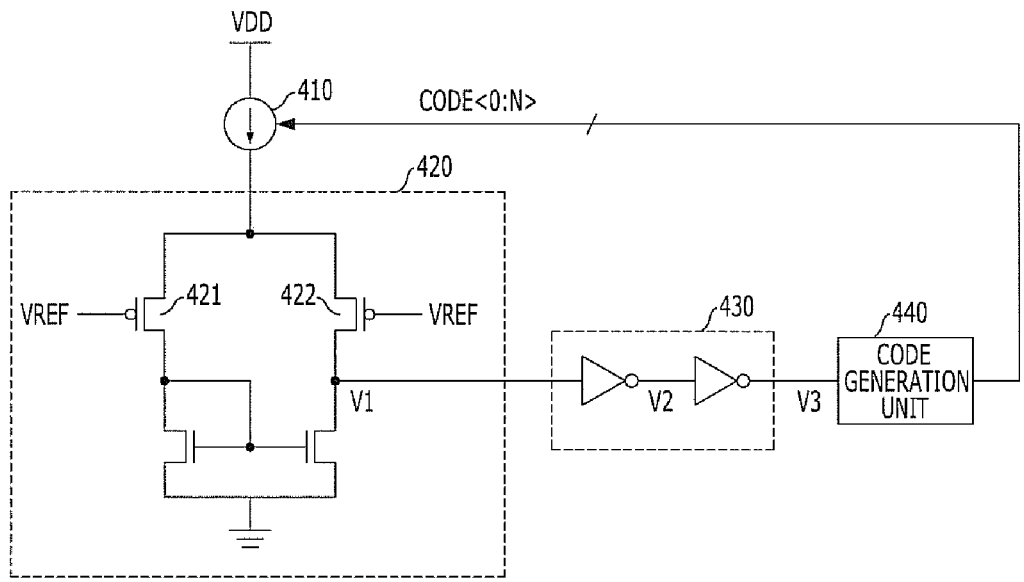
FIG. 4 is a configuration diagram of a buffer control circuit in accordance with an embodiment of the present invention.

FIG. 4 is a configuration diagram of a buffer control circuit in accordance with an embodiment of the present invention.

Referring to FIG. 4, the buffer control circuit includes a current supply unit 410, an amplifier type buffer 420, an inverter type buffer 430, and a code generation unit 440.

The current supply unit 410 is configured to supply an amount of current determined depending upon codes CODE<0:N> to the amplifier type buffer 420. Here, the current supply unit 410 adjusts current supplied to the amplifier type buffer in response to the value of the codes CODE<0:N>.

The amplifier type buffer 420 is configured to operate by using the current supplied from the current supply unit 410 and output to an output terminal V1 a value obtained by comparing a reference potential VREF received at one input to a reference potential VREF received at another input. In FIG. 4, according to an example, the amplifier type buffer 420 is illustrated as a P-type differential amplifier which receives an input signal (that is, the reference potential VREF) using a pair of PMOS transistors 421 and 422. The reference potential VREF is used as a reference for discriminating a logic high level and a logic low level. In general, ½*power supply voltage VDD is used as the reference potential VREF.

The inverter type buffer 430 is configured to receive and output the signal outputted from the output terminal V1 of the amplifier type buffer 420. The inverter type buffer 430 is a buffer constituted by a logic gate, such as an inverter, a NAND gate, a NOR gate, and the like, which is placed at a rear end of the amplifier type buffer 420 in the buffer circuit. It is illustrated in the drawing that the inverter type buffer 430 includes two inverters.

The code generation unit 440 is configured to generate the codes CODE<0:N> in response to the signal outputted from an output terminal V3 of the inverter type buffer 430. When the signal outputted from the output terminal V3 of the inverter type buffer 430 is recognized as a logic high level, the code generation unit 440 controls the codes CODE<0:N> to decrease the amount of current to be supplied by the current supply unit 410, and when the signal outputted from the output terminal V3 of the inverter type buffer 430 is recognized as a logic low level, the code generation unit 440 controls the codes CODE<0:N> to increase the amount of current to be supplied by the current supply unit 410. Here, since the same voltage (exemplified as the reference potential VREF) is applied to the differential input terminals of the amplifier type buffer 420, if the signal outputted from the output terminal V3 of the inverter type buffer 430 is recognized as the logic high level, it is determined that an integrated circuit recognizes the logic level of the signal to be higher than a reference and thus the amount of current supplied to the amplifier type buffer 420 is decreased and the voltage level of the signal outputted from the output terminal V1 of the amplifier type buffer 420 is decreased. Further, if the signal outputted from the output terminal V3 of the inverter type buffer 430 is recognized as the logic low level, it is determined that the integrated circuit recognizes the logic level of the signal to be lower than the reference and the amount of current supplied to the amplifier type buffer 420 is increased and the voltage level of the signal outputted from the output terminal V1 of the amplifier type buffer 420 is raised.

The codes CODE<0:N> generated by the buffer control circuit are transferred to a plurality of buffer circuits (not shown) which are provided in the integrated circuit including the buffer control circuit such that the plurality of buffer circuits may accurately recognize the logic values of input signals by using the codes CODE<0:N>.

That is to say, in the embodiment of the present invention, in a state in which the same reference potential VREF is applied to the differential input terminals of the amplifier type buffer 420, an amount of current supplied to the amplifier type buffer 420 is controlled depending upon the output of the inverter type buffer 430, whereby the integrated circuit including the buffer control circuit may accurately recognize the logic values of input signals.

Figure 5:
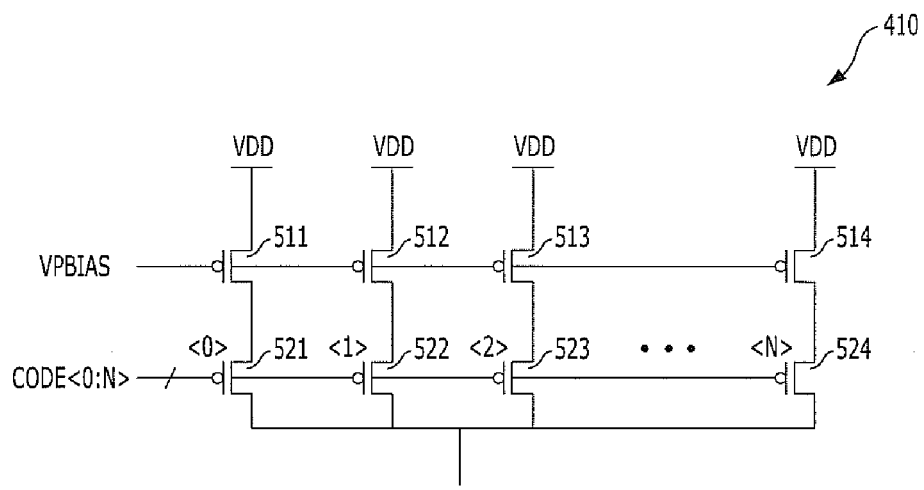
FIG. 5 is a configuration diagram of an exemplary embodiment of the current supply unit shown in FIG. 4.

FIG. 5 is a configuration diagram of an exemplary embodiment of the current supply unit 410 shown in FIG. 4.

Referring to FIG. 5, the current supply unit 410 includes PMOS transistors 511 to 514 which receive a bias voltage VPBIAS and PMOS transistors 521 to 524 which are turned on and off by the codes CODE<0:N>. As to the operations of the current supply unit 410, since some of the PMOS transistors 521 to 524 are turned on and the remaining PMOS transistors 521 to 524 are turned off by the codes CODE<0:N>, the amount of current to be supplied by the current supply unit 410 is changed depending upon the value of the codes CODE<0:N>. In detail, the amount of current decreases as the value of the codes CODE<0:N> becomes larger (approaching 111 . . . 1) and increases as the value of the codes CODE<0:N> becomes smaller (approaching 000 . . . 0).

The size of the PMOS transistors 521 to 524 is selected to have binary weights.

Figure 6:
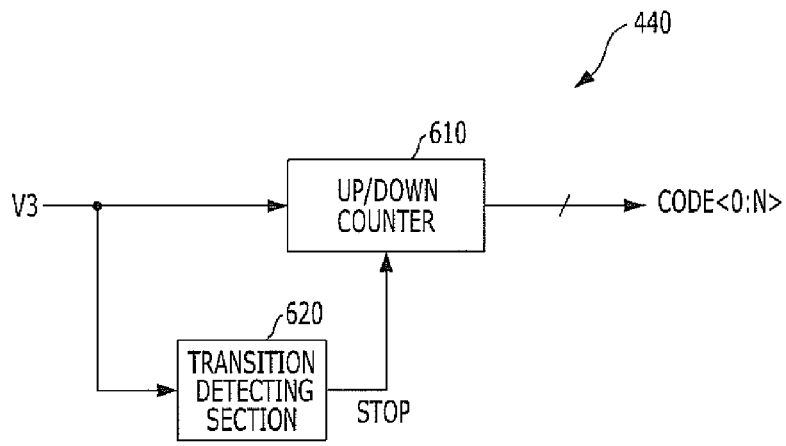
FIG. 6 is a configuration diagram of an exemplary embodiment of the code generation unit shown in FIG. 4.

FIG. 6 is a configuration diagram of an exemplary embodiment of the code generation unit 440 shown in FIG. 4.

Referring to FIG. 6, the code generation unit 440 includes an up/down counter 610 and a transition detecting section 620.

The up/down counter 610 is configured to increase/decrease the value of the codes CODE<0:N> in response to the signal outputted from the output terminal V3 of the inverter type buffer 430. If the signal has the high level, the up/down counter 610 increases the value of the codes CODE<0:N>, and if the signal has the low level, the up/down counter 610 decreases the value of the codes CODE<0:N>. If a stop signal STOP is activated, the up/down counter 610 stops an operation and locks the value of the codes CODE<0:N> to a value stored in the up/down counter 610, for example, at the time of the activation.

The transition detecting section 620 is configured to activate the stop signal STOP when the logic level of the signal outputted from the output terminal V3 of the inverter type buffer 430 transitions. That is to say, if the signal outputted from the output terminal V3 transitions from a logic high level to a logic low level or from a logic low level to a logic high level, the transition detecting section 620 activates the stop signal STOP. If the signal outputted from the output terminal V3 transitions after the operation of the code generation unit 440 is started, the codes CODE<0:N> output from the up/down counter 610 is locked since the locked codes CODE<0:N> indicates the threshold supply current of the current supply unit 410 between a logic high level and a logic low level of the signal outputted from the output terminal V3 when the reference potential VREF is applied as an input. The locked codes CODE<0:N> can be used without a further adjustment of current supplied by the current supply unit 410.

Figure 7:
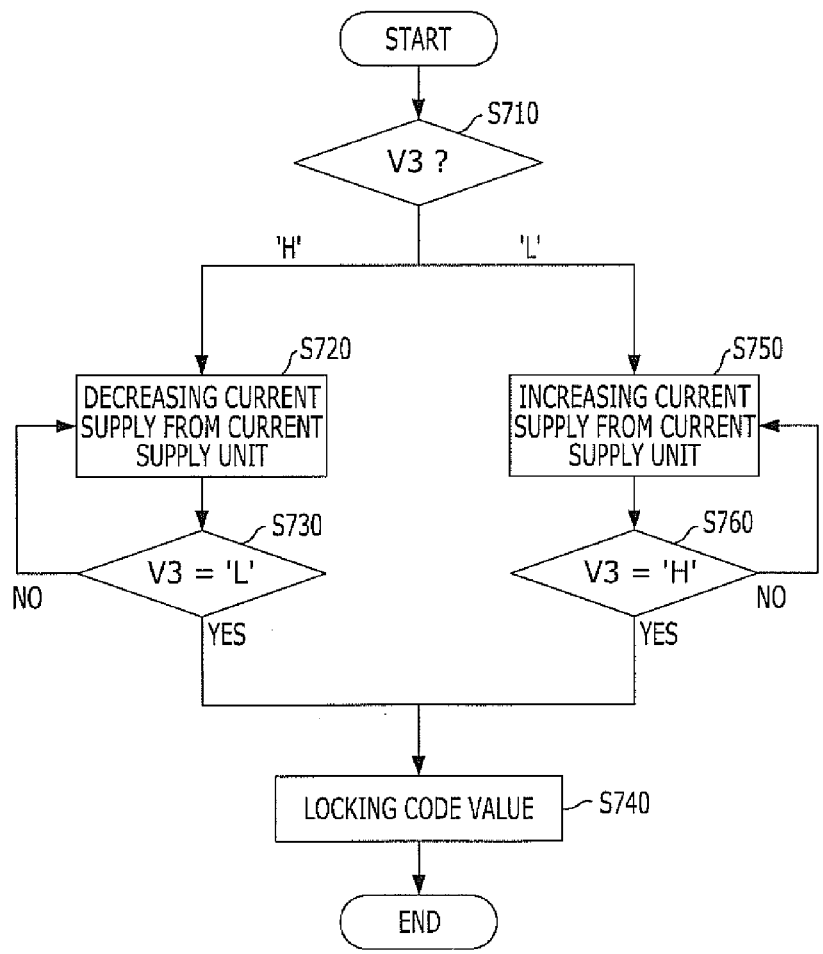
FIG. 7 is a flow chart showing the operations of the code generation unit shown in FIG. 6.

FIG. 7 is a flow chart showing the operations of the code generation unit 440 shown in FIG. 6.

If the operation of the code generation unit 440 is started, the logic value of the signal outputted from the output terminal V3 of the inverter type buffer 430 is discriminated at step S710. If the logic value of the signal outputted from the output terminal V3 discriminated at the step S710 has the logic high level, the value of the codes CODE<0:N> is controlled at step S720 such that the amount of current to be supplied by the current supply unit 410 is decreased. In other words, the value of the codes CODE<0:N> is increased. Whether the logic value of the signal outputted from the output terminal V3 transitions to the logic low level is determined at step S730. In the case where the logic value of the signal outputted from the output terminal V3 still has the logic high level, the step S720 is repeated. In the case where the logic value of the signal outputted from the output terminal V3 transitions to the logic low level, the value of the codes CODE<0:N> is locked and the operation of the code generation unit 440 is stopped at step S740.

If the logic value of the signal outputted from the output terminal V3 discriminated at the step S710 has the logic low level, the value of the codes CODE<0:N> is controlled at step S750 such that the amount of current to be supplied by the current supply unit 410 is increased. In other words, the value of the codes CODE<0:N> is decreased. Whether the logic value of the signal outputted from the output terminal V3 transitions to the logic high level is determined at step S760. In the case where the logic value of the signal outputted from the output terminal V3 still has the logic low level, the step S750 is repeated. In the case where the logic value of the signal outputted from the output terminal V3 transitions to the logic high level, the value of the codes CODE<0:N> is locked and the operation of the code generation unit 440 is stopped at the step S740.

The steps S710, S720 and S750 may be executed by the up/down counter 610, and the steps S730, S740 and S760 may be executed by the transition detecting section 620.

Figure 8:
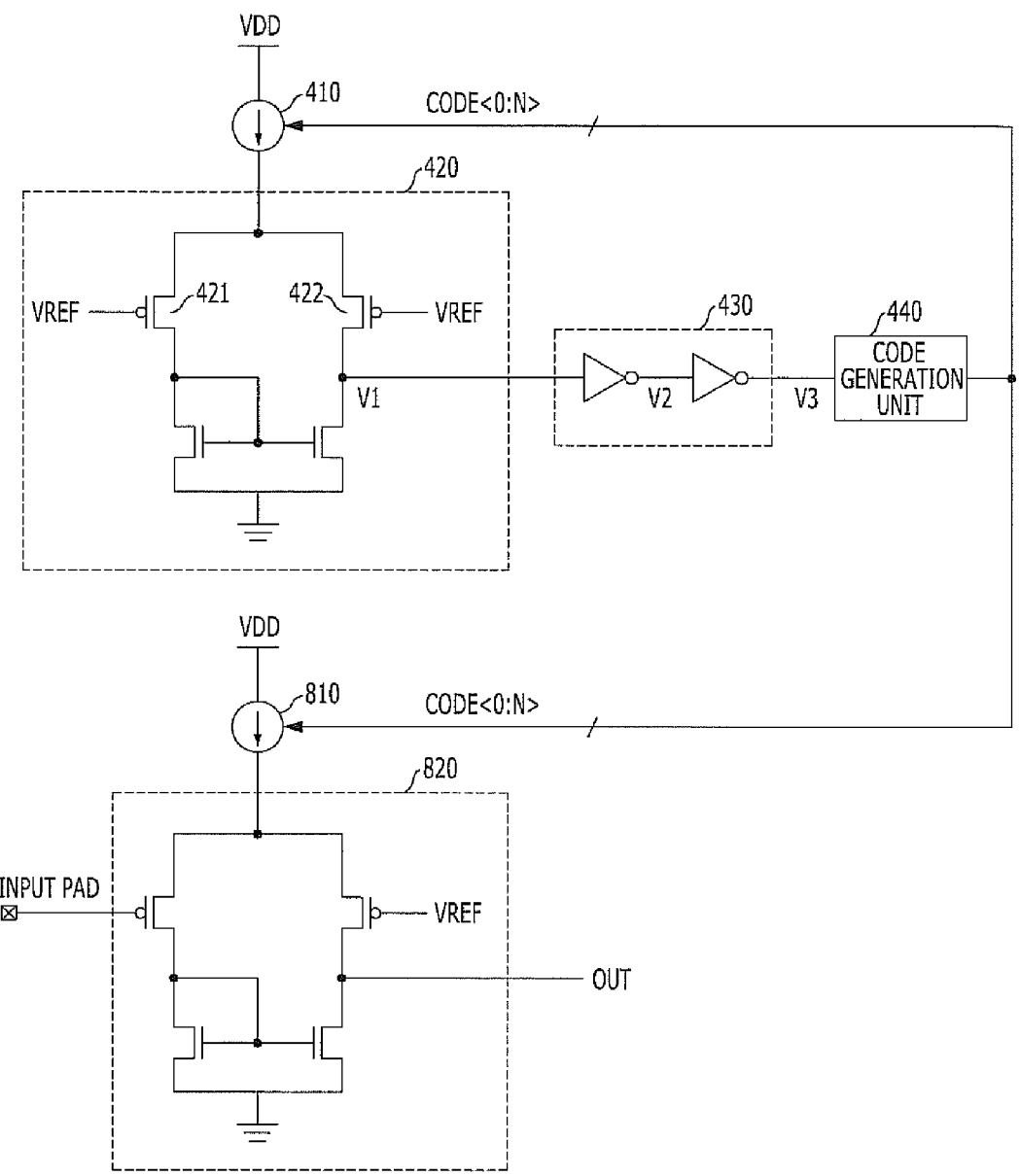
FIG. 8 is a configuration diagram of an exemplary embodiment of an integrated circuit including the buffer control circuit shown in FIG. 4.

FIG. 8 is a configuration diagram of an exemplary embodiment of an integrated circuit including the buffer control circuit shown in FIG. 4. In order to distinguish the internal configuration of the buffer control circuit and a configuration for receiving the signal of an input pad, the word, 'replica' will be attached to the component names of the buffer control circuit.

Referring to FIG. 8, the integrated circuit includes a replica current supply unit 410 configured to supply an amount of current which is determined depending upon codes CODE<0: N>; a replica amplifier type buffer 420 configured to operate using the current supplied from the replica current supply unit 410 and output a value obtained by comparing a reference potential VREF and a reference potential VREF; an inverter type buffer 430 configured to buffer the output of the replica amplifier type buffer 420; a code generation unit 440 configured to generate the codes CODE<0:N> in response to the output of the inverter type buffer 430; an input pad INPUT PAD; a current supply unit 810 configured to supply an amount of current which is determined depending upon the codes CODE<0:N>; and an amplifier type buffer 820 configured to operate using the current supplied from the current supply unit 810 and output a result of comparing the signal inputted to the input pad INPUT PAD and the reference potential VREF.

The codes CODE<0:N> generated by the buffer control circuit are transferred to the current supply unit 810 which is provided on the side of the input pad INPUT PAD, and the amplifier type buffer 820 operates using the current transferred from the current supply unit 810. Accordingly, the amplifier type buffer 820 and a circuit (not shown) coupled to terminal OUT to receive the output signal thereof as an input can accurately recognize the logic value of the signal inputted to the input pad INPUT PAD.

The replica current supply unit 410 and the current supply unit 810 are configured in the same way, and the replica amplifier type buffer 420 and the amplifier type buffer 820 are configured in the same way.

While one input pad INPUT PAD, one current supply unit 810 and one amplifier type buffer 820 are shown in FIG. 8, a plurality of input pads, a plurality of current supply units and a plurality of amplifier type buffers may be provided in the integrated circuit. Further, after the generation of the codes CODE<0:N> is completed, the replica current supply unit 410 and the replica amplifier type buffer 420 may be used to buffer a signal which is inputted from an outside of the integrated circuit other than the reference potential VREF received as its one input node.

While it is illustrated in FIG. 8 that the codes CODE<0:N> generated by the buffer control circuit 410 to 440 are directly transferred to the current supply unit 810, the codes CODE<0:N> generated by the buffer control circuit 410 to 440 may be transferred to the current supply unit 810 after being stored in a register or a fuse circuit. Moreover, the buffer control circuit 410 to 440 may generate the codes CODE<0:N> by being operated during the initialization period of the integrated circuit or in advance during the test process of the integrated circuit. Furthermore, the buffer control circuit 410 to 440 may be designed to update the value of the codes CODE<0:N> at a periodic cycle during the operation of the integrated circuit.

Figure 9:
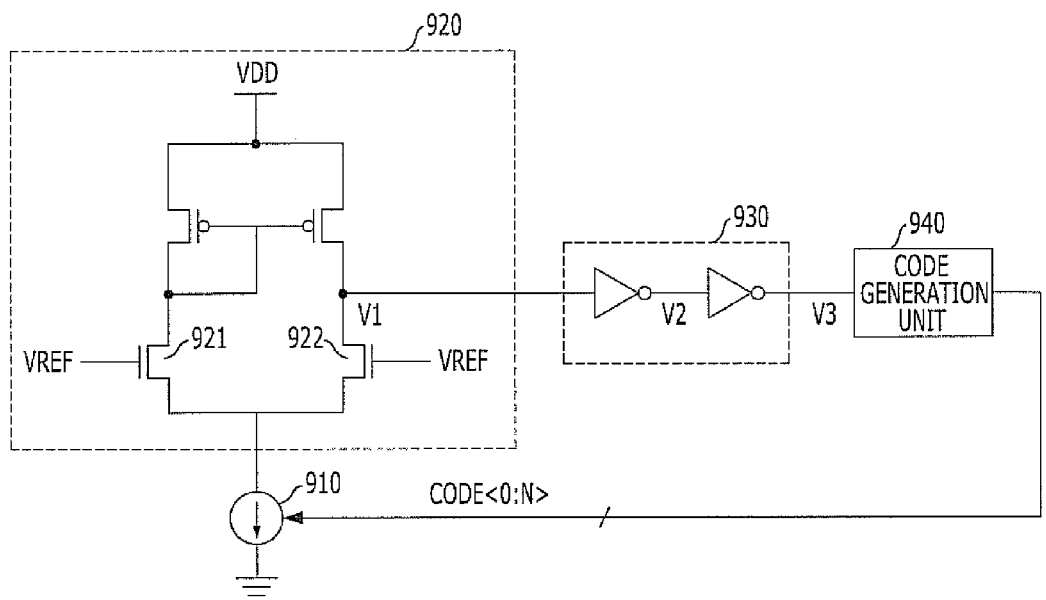
FIG. 9 is a configuration diagram of a buffer control circuit in accordance with another embodiment of the present invention.

FIG. 9 is a configuration diagram of a buffer control circuit in accordance with another embodiment of the present invention.

Referring to FIG. 9, the buffer control circuit includes a current sinking unit 910, an amplifier type buffer 920, an inverter type buffer 930, and a code generation unit 940.

The current sinking unit 910 is configured to sink an amount of current determined depending upon codes CODE<0:N> from the amplifier type buffer 920. Here, the current sinking unit 910 is a current source which sinks current in response to the value of the codes CODE<0:N>.

The amplifier type buffer 920 is configured to output a value obtained to an output terminal V1 by comparing a reference potential VREF at one input to a reference potential VREF at another input. In FIG. 9, according to an example, the amplifier type buffer 920 is illustrated as an N-type differential amplifier which receives an input signal (that is, the reference potential VREF) using a pair of NMOS transistors 921 and 922. The reference potential VREF is used as a reference for discriminating a logic high level and a logic low level. In general, ½*power supply voltage VDD is used as the reference potential VREF.

The inverter type buffer 930 is configured to receive and output the signal outputted from the output terminal V1 of the amplifier type buffer 920. The inverter type buffer 930 is a buffer constituted by a logic gate, such as an inverter, a NAND gate, a NOR gate, and the like, which is placed at a rear end of the amplifier type buffer 920 in the buffer circuit. It is illustrated in the drawing that the inverter type buffer 930 includes two inverters.

The code generation unit 940 is configured to generate the codes CODE<0:N> in response to the signal outputted from an output terminal V3 of the inverter type buffer 930. When the signal outputted from the output terminal V3 of the inverter type buffer 930 is recognized as a logic high level, the code generation unit 940 controls the codes CODE<0:N> to increase the amount of current to be sunken by the current sinking unit 910, and when the signal outputted from the output terminal V3 of the inverter type buffer 930 is recognized as a logic low level, the code generation unit 940 controls the codes CODE<0:N> to decrease the amount of current to be sunken by the current sinking unit 910.

The embodiment shown in FIG. 9 is different from the embodiment shown in FIG. 4 in that the FIG. 9 circuit does not control an amount of current supplied to the amplifier type buffer but an amount of current sunken from the amplifier type buffer 920. Therefore, in the embodiment shown in FIG. 9, if the signal outputted from the output terminal V3 of the inverter type buffer 930 is recognized as the logic high level, sinking current is increased to lower the voltage level of the signal outputted from the output terminal V1 of the amplifier type buffer 920. Also, if the signal outputted from the output terminal V3 of the inverter type buffer 930 is recognized as the logic low level, sinking current is decreased to raise the voltage level of the signal outputted from the output terminal V1 of the amplifier type buffer 920. Otherwise, the embodiment shown in FIG. 9 has the same features as the embodiment shown in FIG. 4.

Figure 10:
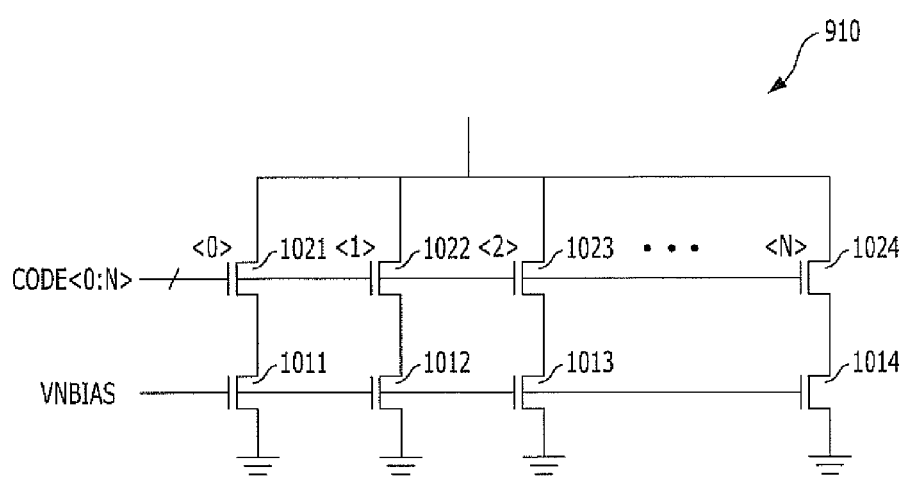
FIG. 10 is a configuration diagram of an exemplary embodiment of the current sinking unit shown in FIG. 9.

FIG. 10 is a configuration diagram of an exemplary embodiment of the current sinking unit 910 shown in FIG. 9.

Referring to FIG. 10, the current sinking unit 910 includes NMOS transistors 1011 to 1014 which receive a bias voltage VNBIAS and NMOS transistors 1021 to 1024 which are turned on and off by the codes CODE<0:N>. As to the operations of the current sinking unit 910, since some of the NMOS transistors 1021 to 1024 are turned on and the remaining NMOS transistors 1021 to 1024 are turned off by the codes CODE<0:N>, the amount of current to be sunken by the current sinking unit 910 is changed depending upon the value of the codes CODE<0:N>. In detail, the amount of current increases as the value of the codes CODE<0:N> becomes larger (approaching 111 . . . 1) and decreases as the value of the codes CODE<0:N> becomes smaller (approaching 000 . . . 0).

The size of the NMOS transistors 1021 to 1024 is selected to have binary weights.

Figure 11:
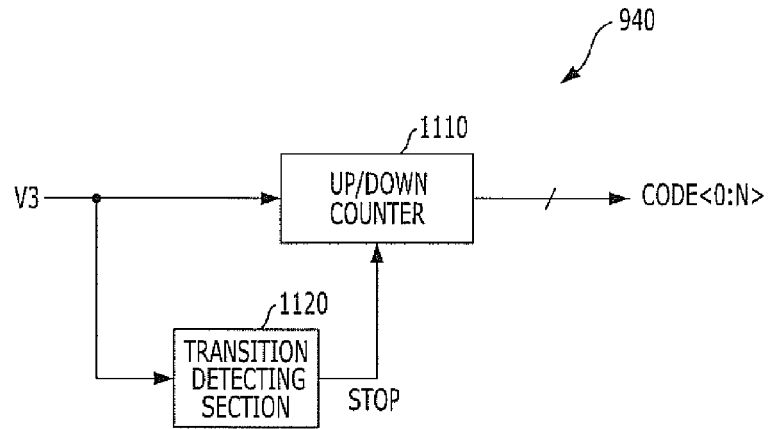
FIG. 11 is a configuration diagram of an exemplary embodiment of the code generation unit shown in FIG. 9.

FIG. 11 is a configuration diagram of an exemplary embodiment of the code generation unit 940 shown in FIG. 9.

Referring to FIG. 11, the code generation unit 940 includes an up/down counter 1110 and a transition detecting section 1120.

The up/down counter 1110 is configured to increase/decrease the value of the codes CODE<0:N> in response to the signal outputted from the output terminal V3 of the inverter type buffer 930. If the signal has the high level, the up/down counter 1110 increases the value of the codes CODE<0:N>, and if the signal has the low level, the up/down counter 1110 decreases the value of the codes CODE<0:N>. If a stop signal STOP is activated, the up/down counter 1110 stops an operation and locks the value of the codes CODE<0:N> to a value stored in the up/down counter 1110, for example, at the time of the activation.

The transition detecting section 1120 is configured to activate the stop signal STOP when the logic level of the signal outputted from the output terminal V3 of the inverter type buffer 430 transitions. That is to say, if the signal outputted from the output terminal V3 transitions from a logic high level to a logic low level or from a logic low level to a logic high level, the transition detecting section 1120 activates the stop signal STOP. If the signal outputted from the output terminal V3 transitions after the operation of the code generation unit 940 is started, the codes CODE<0:N> output from the up/down counter 610 is locked since the locked codes CODE<0:N> indicates the threshold supply current of the current sinking unit 910 between a logic high level and a logic low level of the signal outputted from the output terminal V3 when the reference potential VREF is applied as an input. The locked codes CODE<0:N> can be used without a further adjustment of current supplied by the current sinking unit 910.

Figure 12:
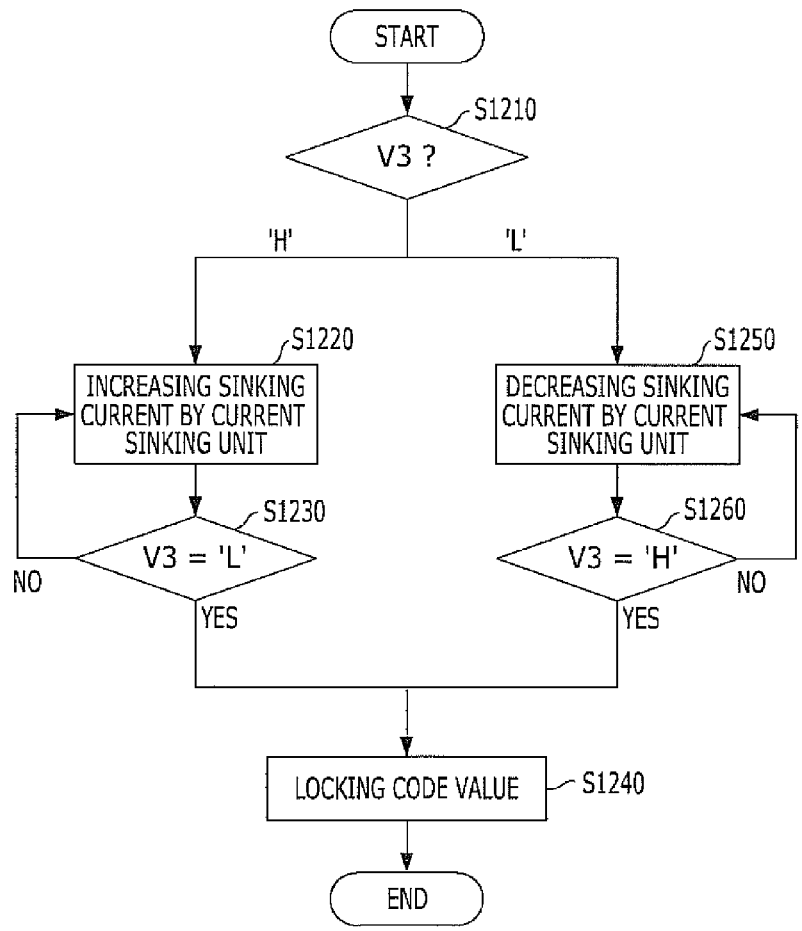
FIG. 12 is a flow chart showing the operations of the code generation unit shown in FIG. 11.

FIG. 12 is a flow chart showing the operations of the code generation unit 940 shown in FIG. 11.

If the operation of the code generation unit 940 is started, the logic value of the signal outputted from the output terminal V3 of the inverter type buffer 930 is discriminated at step S1210. If the logic value of the signal outputted from the output terminal V3 discriminated at the step S1210 has the logic high level, the value of the codes CODE<0:N> is controlled at step S1220 such that the amount of current to be sunken by the current sinking unit 910 is increased. In other words, the value of the codes CODE<0:N> is increased. Whether the logic value of the signal outputted from the output terminal V3 transitions to the logic low level is determined at step S1230. In the case where the logic value of the signal outputted from the output terminal V3 still has the logic high level, the step S1220 is repeated. In the case where the logic value of the signal outputted from the output terminal V3 transitions to the logic low level, the value of the codes CODE<0:N> is locked and the operation of the code generation unit 940 is stopped at step S1240.

If the logic value of the signal outputted from the output terminal V3 discriminated at the step S1210 has the logic low level, the value of the codes CODE<0:N> is controlled at step S1250 such that the amount of current to be sunken by the current sinking unit 910 is decreased. In other words, the value of the codes CODE<0:N> is decreased. Whether the logic value of the signal outputted from the output terminal V3 transitions to the logic high level is determined at step S1260. In the case where the logic value of the signal outputted from the output terminal V3 still has the logic low level, the step S1250 is repeated. In the case where the logic value of the signal outputted from the output terminal V3 transitions to the logic high level, the value of the codes CODE<0:N> is locked and the operation of the code generation unit 940 is stopped at the step S1240.

The steps S1210, S1220 and S1250 may be executed by the up/down counter 1110, and the steps S1230, S1240 and S1260 may be executed by the transition detecting section 1120.

Figure 13:
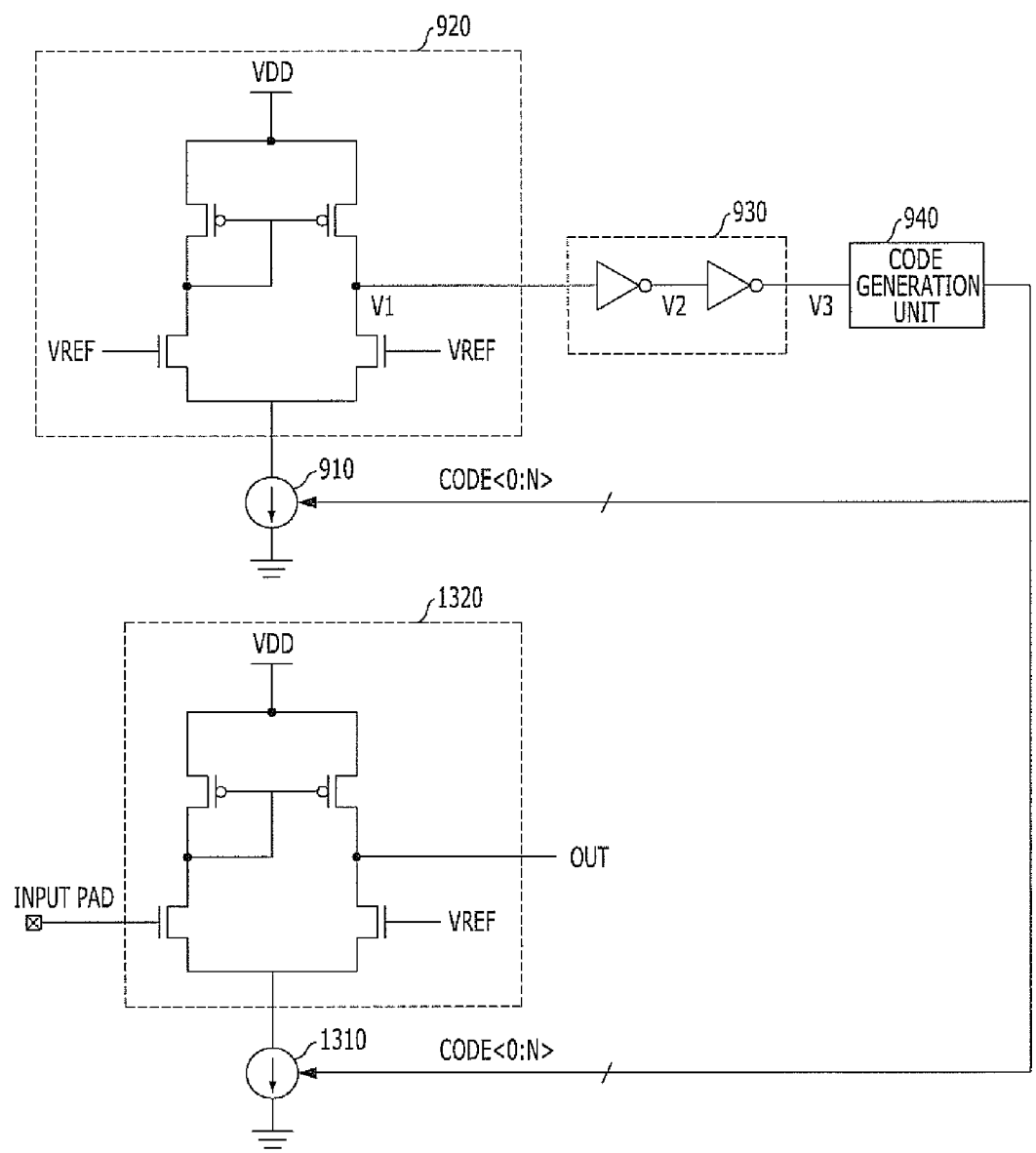
FIG. 13 is a configuration diagram of an exemplary embodiment of an integrated circuit including the buffer control circuit shown in FIG. 9.

FIG. 13 is a configuration diagram of an exemplary embodiment of an integrated circuit including the buffer control circuit shown in FIG. 9. In order to distinguish the internal configuration of the buffer control circuit and a configuration for receiving the signal of an input pad, the word, 'replica' will be attached to the component names of the buffer control circuit.

Referring to FIG. 13, the integrated circuit includes a replica amplifier type buffer 920 configured to output a value obtained by comparing a reference potential VREF and a reference potential VREF; a replica current sinking unit 910 configured to sink an amount of current which is determined depending upon codes CODE<0:N>, from the replica amplifier type buffer 920; a replica inverter type buffer 930 configured to buffer the signal outputted from an output terminal V1 of the replica amplifier type buffer 920; a code generation unit 940 configured to generate the codes CODE<0:N> in response to the signal outputted from an output terminal V3 of the replica inverter type buffer 930; an input pad INPUT PAD; an amplifier type buffer 1320 configured to output a result of comparing the signal inputted to the input pad INPUT PAD and the reference potential VREF; and a current sinking unit 1310 configured to sink an amount of current which is determined depending upon the codes CODE<0:N>, from the amplifier type buffer 1320.

The codes CODE<0:N> generated by the buffer control circuit are transferred to the current sinking unit 1310 which is provided on the side of the input pad INPUT PAD, and the amplifier type buffer 1320 operates using the current transferred from the current sinking unit 1310. Accordingly, the amplifier type buffer 1320 and a circuit (not shown) coupled to terminal OUT to receive the output signal thereof as an input can accurately recognize the logic value of the signal inputted to the input pad INPUT PAD.

The replica current sinking unit 910 and the current sinking unit 1310 are configured in the same way, and the replica amplifier type buffer 920 and the amplifier type buffer 1320 are configured in the same way.

While one input pad INPUT PAD, one current sinking unit 1310 and one amplifier type buffer 1320 are shown in FIG. 13, a plurality of input pads, a plurality of current sinking units and a plurality of amplifier type buffers may be provided in the integrated circuit. Further, after the generation of the codes CODE<0:N> is completed, the replica current sinking unit 1310 and the replica amplifier type buffer 1320 may be used to buffer a signal which is inputted from an outside of the integrated circuit other than the reference potential VREF received as its one input.

While it is illustrated in FIG. 13 that the codes CODE<0: N> generated by the buffer control circuit 910 to 940 are directly transferred to the current sinking unit 1310, the codes CODE<0:N> generated by the buffer control circuit 910 to 940 may be transferred to the current sinking unit 1310 after being stored in a register or a fuse circuit. Moreover, the buffer control circuit 910 to 940 may generate the codes CODE<0:N> by being operated during the initialization period of the integrated circuit or in advance during the test process of the integrated circuit. Furthermore, the buffer control circuit 910 to 940 may be designed to update the value of the codes CODE<0:N> by being operated at a periodic cycle during the operation of the integrated circuit.

Figure 14:
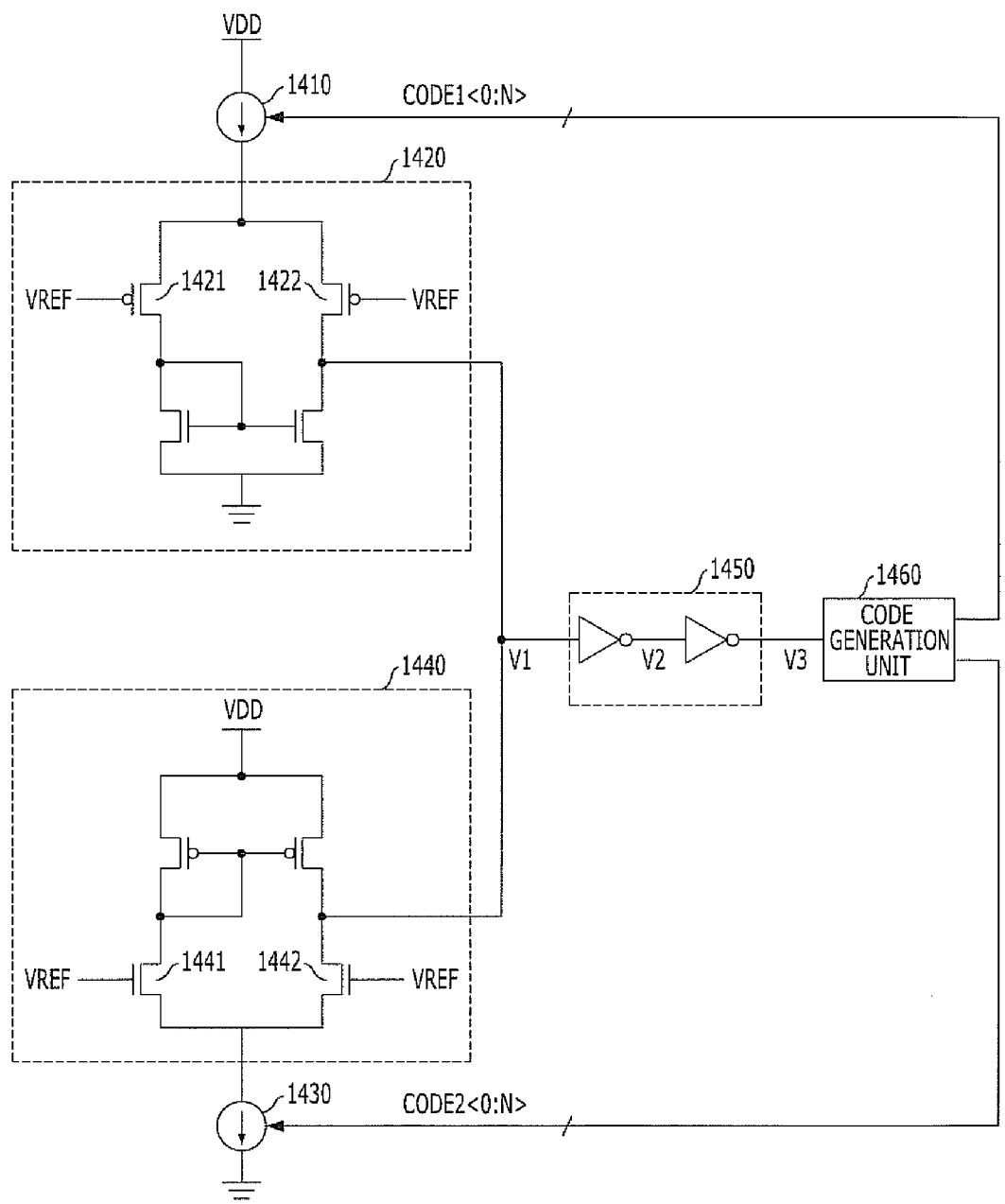
FIG. 14 is a configuration diagram of a buffer control circuit in accordance with an embodiment of the present invention.

FIG. 14 is a configuration diagram of a buffer control circuit in accordance with an embodiment of the present invention.

Referring to FIG. 14, the buffer control circuit includes a current supply unit 1410, a first amplifier type buffer 1420, a second amplifier type buffer 1440, a current sinking unit 1430, an inverter type buffer 1450, and a code generation unit 1460.

The current supply unit 1410 is configured to supply an amount of current determined depending upon first codes CODE1<0:N> to the first amplifier type buffer 1420. The current supply unit 1410 may be configured in the same way as shown in FIG. 5.

The first amplifier type buffer 1420 is configured to operate by using the current supplied from the current supply unit 1410 and output to an output terminal V1 a value obtained by comparing a reference potential VREF received at one input node to a reference potential VREF received at another input node. According to an example, the first amplifier type buffer 1420 is illustrated as a P-type differential amplifier which receives an input signal (that is, the reference potential VREF) using a pair of PMOS transistors 1421 and 1422.

The current sinking unit 1430 is configured to sink an amount of sinking current which is determined depending upon second codes CODE2<0:N>, from the second amplifier type buffer 1440. The current sinking unit 1430 may be configured in the same way as shown in FIG. 10.

The second amplifier type buffer 1440 is configured to drive a value obtained by comparing a reference potential VREF and a reference potential VREF to the output terminal V1. According to an example, the second amplifier type buffer 1440 is illustrated as an N-type differential amplifier which receives an input signal (that is, the reference potential VREF) using a pair of NMOS transistors 1441 and 1442.

Since the first amplifier type buffer 1420 is a P-type and the second amplifier type buffer 1440 is an N-type, the characteristics of the first amplifier type buffer 1420 and the second amplifier type buffer 1440 are different from each other. Here, by using the first amplifier type buffer 1420 and the second amplifier type buffer 1440 together, the characteristics of a buffer may be improved.

The inverter type buffer 1450 is configured to receive and output the signal outputted from the output terminal V1 of the first and second amplifier type buffers 1420 and 1440. The inverter type buffer 1450 is a buffer constituted by a logic gate, such as an inverter, a NAND gate, a NOR gate, and the like, which is placed to receive the signal outputted at the output terminal V1 as an input. It is illustrated in the drawing that the inverter type buffer 1450 includes two inverters.

The code generation unit 1460 is configured to generate the first codes CODE1<0:N> and the second codes CODE2<0:N> in response to the signal outputted from an output terminal V3 of the inverter type buffer 1450. When the signal outputted from the output terminal V3 of the inverter type buffer 1450 is recognized as a logic high level, the code generation unit 1460 controls the first and second codes CODE1<0:N> and CODE2<0:N> to increase the amount of sinking current of the current sinking unit 1430 relative to the amount of supply current of the current supply unit 1410, and when the signal outputted from the output terminal V3 of the inverter type buffer 1450 is recognized as a logic low level, the code generation unit 1460 controls the first and second codes CODE1<0:N> and CODE2<0:N> to increase the amount of supply current of the current supply unit 1410 relative to the amount of sinking current of the current sinking unit 1430.

The embodiment of FIG. 14 has a combined form of the embodiment of FIG. 4 and the embodiment of FIG. 9 and includes the characteristics of the embodiment of FIG. 4 and the embodiment of FIG. 9.

Figure 15:
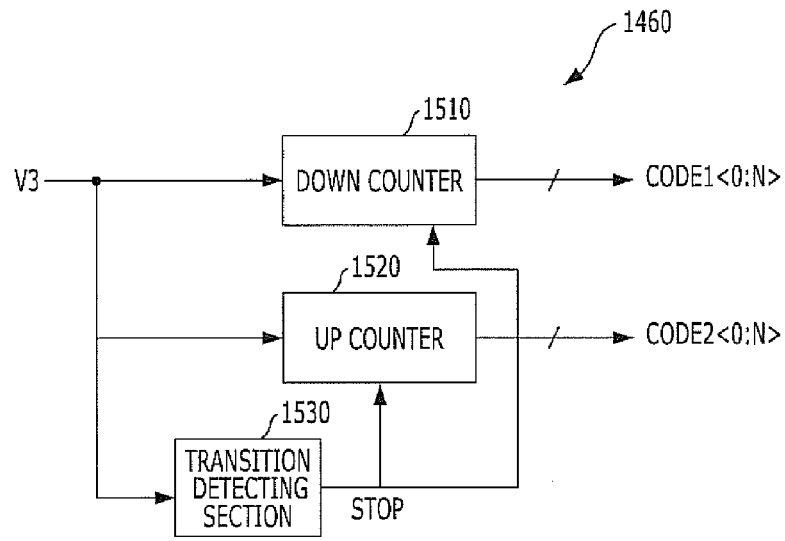
FIG. 15 is a configuration diagram of an exemplary embodiment of the code generation unit shown in FIG. 14.

FIG. 15 is a configuration diagram of an exemplary embodiment of the code generation unit 1460 shown in FIG. 14.

Referring to FIG. 15, the code generation unit 1460 includes a down counter 1510, an up counter 1520, and a transition detecting section 1530.

The down counter 1510 is configured to decrease the value of the first codes CODE1<0:N> in response to the signal outputted from the output terminal V3 of the inverter type buffer 1450. If the signal outputted from the output terminal V3 of the inverter type buffer 1450 has the low level, the down counter 1510 decreases the value of the first codes CODE1<0:N> so that an amount of current to be supplied by the current supply unit 1410 can be increased. If a stop signal STOP is activated, the down counter 1510 stops an operation and locks the value of the first codes CODE1<0:N>.

The up counter 1520 is configured to increase the value of the second codes CODE2<0:N> in response to the signal outputted from the output terminal V3 of the inverter type buffer 1450. If the signal outputted from the output terminal V3 of the inverter type buffer 1450 has the high level, the up counter 1520 increases the value of the second codes CODE2<0:N> so that an amount of current sunken by the current sinking unit 1430 can be increased. If the stop signal STOP is activated, the up counter 1520 stops an operation and locks the value of the second codes CODE2<0:N>.

The transition detecting section 1530 is configured to activate the stop signal STOP when the logic level of the signal outputted from the output terminal V3 of the inverter type buffer 1450 transitions. That is to say, if the signal outputted from the output terminal V3 transitions from a logic high level to a logic low level or from a logic low level to a logic high level, the transition detecting section 1530 activates the stop signal STOP. If the signal outputted from the output terminal V3 transitions after the operation of the code generation unit 1460 is started, the codes CODE1<0:N> and the codes CODE2<0:N> output from counters 1510 and 1520 are locked since the locked codes CODE1<0:N> and the locked codes CODE2<0:N> indicate the threshold combined supply/sink currents of the current supply unit 1410 and the current sink unit 1430 between a logic high level and a logic low level of the signal outputted from the output terminal V3 when the reference potential VREF is applied as an input. The locked codes CODE1<0:N> and the locked codes CODE2<0:N> can be used without a further adjustment of currents supplied by the current supply unit 1410 and the current sink unit 1430.

Figure 16:
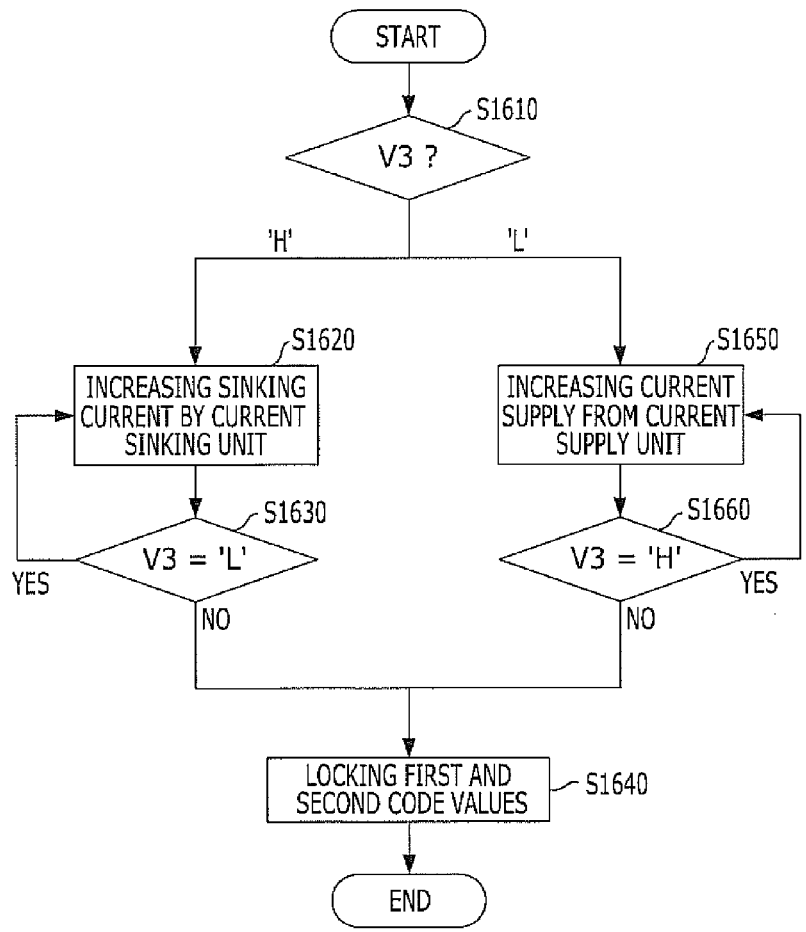
FIG. 16 is a flow chart showing the operations of the code generation unit shown in FIG. 15.

FIG. 16 is a flow chart showing the operations of the code generation unit 1460 shown in FIG. 15.

If the operation of the code generation unit 1460 is started, the logic value of the signal outputted from the output terminal V3 of the inverter type buffer 1450 is discriminated at step S1610. If the logic value of the signal outputted from the output terminal V3 discriminated at the step S1610 has the logic high level, the value of the second codes CODE2<0:N> is controlled at step S1620 such that the amount of current to be sunken by the current sinking unit 1430 is increased. In other words, the value of the second codes CODE2<0:N> is increased. Whether the logic value of the signal outputted from the output terminal V3 transitions to the logic low level is determined at step S1630. In the case where the logic value of the signal outputted from the output terminal V3 still has the logic high level, the step S1620 is repeated. In the case where the logic value of the signal outputted from the output terminal V3 transitions to the logic low level, the value of the second codes CODE2<0:N> is locked and the operation of the code generation unit 1460 is stopped at step S1640.

If the logic value of the signal outputted from the output terminal V3 discriminated at the step S1610 has the logic low level, the value of the first codes CODE1<0:N> is controlled at step S1650 such that the amount of current to be supplied by the current supply unit 1410 is increased. In other words, the value of the first codes CODE1<0:N> is decreased.

Whether the logic value of the signal outputted from the output terminal V3 transitions to the logic high level is determined at step S1660. In the case where the logic value of the signal outputted from the output terminal V3 still has the logic low level, the step S1650 is repeated. In the case where the logic value of the signal outputted from the output terminal V3 transitions to the logic high level, the value of the first codes CODE1<0:N> is locked and the operation of the code generation unit 1460 is stopped at the step S1640.

The steps S1610 and S1620 may be executed by the up counter 1520, and the steps S1610 and S1650 may be executed by the down counter 1510. The steps S1630, S1640 and S1660 may be executed by the transition detecting section 1530.

Figure 17:
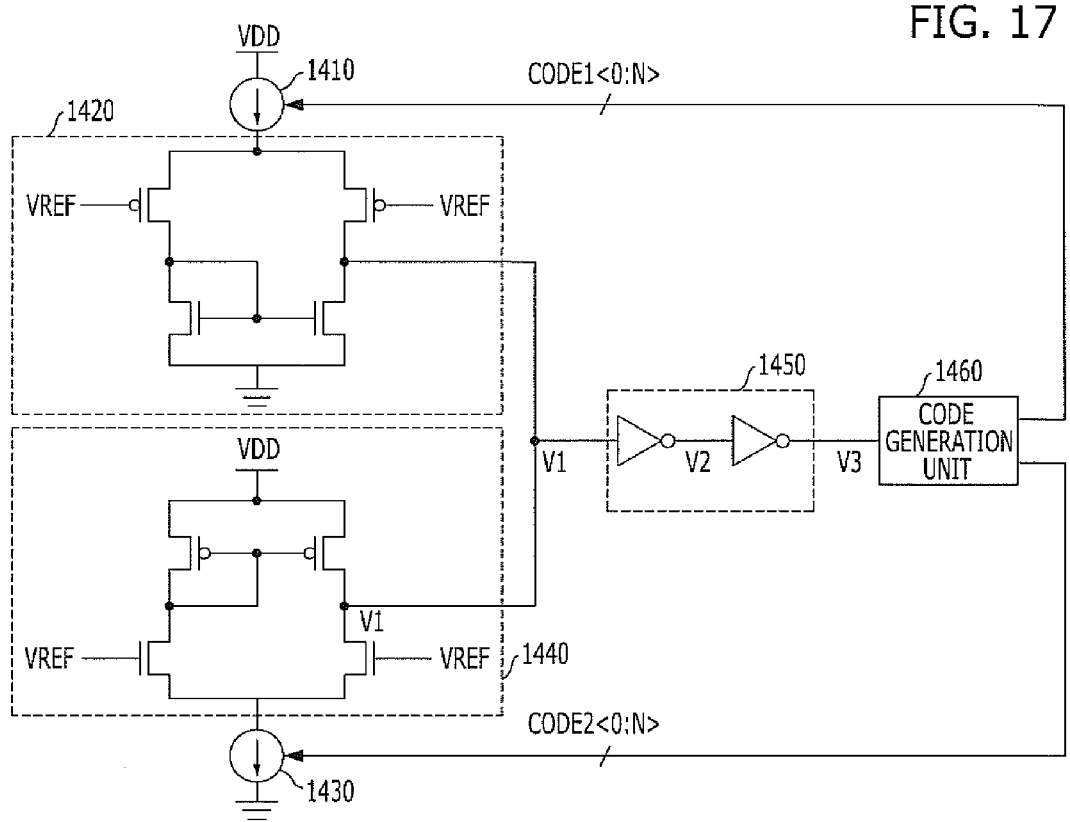
FIG. 17 is a configuration diagram of an exemplary embodiment of an integrated circuit including the buffer control circuit shown in FIG. 14.
Figure 17:
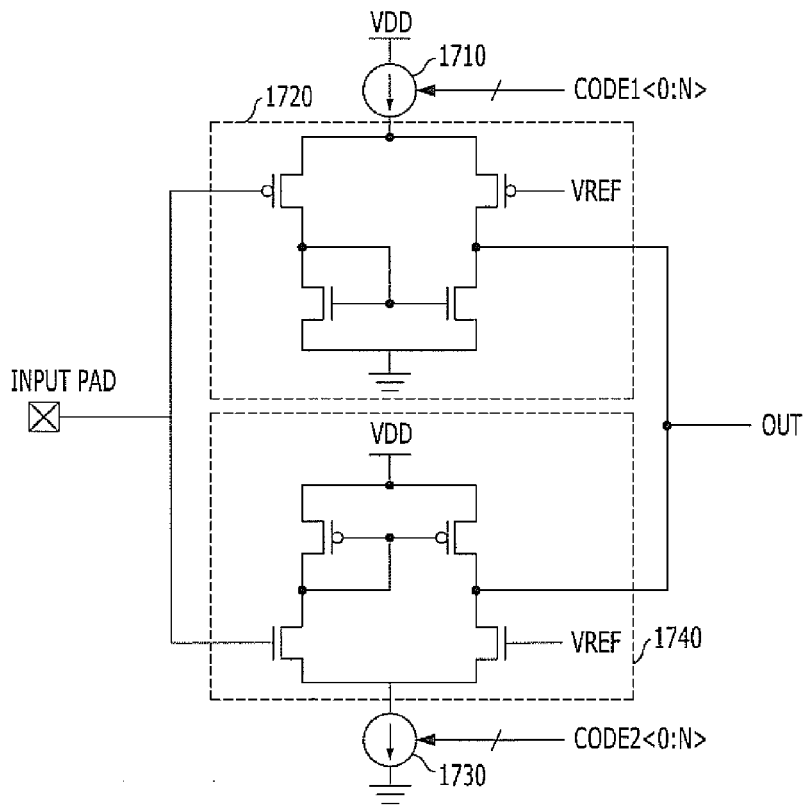

FIG. 17 is a configuration diagram of an exemplary embodiment of an integrated circuit including the buffer control circuit shown in FIG. 14. In order to distinguish the internal configuration of the buffer control circuit and a configuration for receiving the signal of an input pad, the word, 'replica' will be attached to the component names of the buffer control circuit.

Referring to FIG. 17, the integrated circuit includes a replica current supply unit 1410 configured to supply an amount of current which is determined depending upon first codes CODE1<0:N>; a first replica amplifier type buffer 1420 configured to operate using the current supplied from the replica current supply unit 1410 and output a value obtained by comparing a reference potential VREF and a reference potential VREF to an output terminal 1/1; a second replica amplifier type buffer 1440 configured to output a value obtained by comparing a reference potential VREF and a reference potential VREF to the output terminal V1; a replica current sinking unit 1430 configured to sink an amount of sinking current which is determined depending upon second codes CODE2<0:N>, from the second replica amplifier type buffer 1440; a replica inverter type buffer 1450 configured to buffer the signal outputted from the replica output terminal V1; a code generation unit 1460 configured to generate the first codes CODE1<0:N> and the second codes CODE2<0:N> in response to the signal outputted from an output terminal V3 of the replica inverter type buffer 1450; an input pad INPUT PAD; a current supply unit 1710 configured to supply an amount of current which is determined depending upon the first codes CODE1<0:N>; a first amplifier type buffer 1720 configured to operate using the current supplied from the current supply unit 1710 and drive an output node by comparing the signal inputted to the input pad INPUT PAD and the reference potential VREF; a second amplifier type buffer 1740 configured to drive the output node by comparing the signal inputted to the input pad INPUT PAD and the reference potential VREF; and a current sinking unit 1730 configured to sink an amount of sinking current which is determined depending upon the second codes CODE2<0:N>, from the second amplifier type buffer 1740.

The first codes CODE1<0:N> and the second codes CODE2<0:N> generated by the buffer control circuit are transferred to the current supply unit 1710 and the current sinking unit 1730 which are provided on the side of the input pad INPUT PAD so that the first amplifier type buffer 1720 and the second amplifier type buffer 1740 can accurately recognize the logic value of the signal inputted to the input pad INPUT PAD.

The replica current supply unit 1410 and the current supply unit 1710 are configured in the same way, and the first replica amplifier type buffer 1420 and the first amplifier type buffer 1720 are configured in the same way. Furthermore, the replica current sinking unit 1430 and the current sinking unit 1730 are configured in the same way, and the second replica amplifier type buffer 1440 and the second amplifier type buffer 1740 are configured in the same way.

While one input pad INPUT PAD, one current supply unit 1710, one first amplifier type buffer 1720, one current sinking unit 1730 and one second amplifier type buffer 1740 are shown in FIG. 17, a plurality of input pads, a plurality of current supply units, a plurality of first amplifier type buffers, a plurality of current sinking units and a plurality of second amplifier type buffers may be provided in the integrated circuit. Further, after the generation of the first codes CODE1<0:N> and the second codes CODE2<0:N> is completed, the replica current supply unit 1410, the first replica amplifier type buffer 1420, the replica current sinking unit 1430 and the second replica amplifier type buffer 1440 may be used to buffer a signal which is inputted from an outside of the integrated circuit other than the reference potential VREF received as their inputs.

While it is illustrated in FIG. 17 that the first codes CODE1<0:N> and the second codes CODE2<0:N> generated by the buffer control circuit 1410 to 1460 are directly transferred to the current supply unit 1710 and the current sinking unit 1730, the first codes CODE1<0:N> and the second codes CODE2<0:N> generated by the buffer control circuit 1410 to 1460 may be transferred to the current supply unit 1710 and the current sinking unit 1730 after being stored in a register or a fuse circuit. Moreover, the buffer control circuit 1410 to 1460 may generate the first codes CODE1<0:N> and the second codes CODE2<0:N> by being operated during the initialization period of the integrated circuit or in advance during the test process of the integrated circuit. Furthermore, the buffer control circuit 1410 to 1460 may be designed to update the values of the first codes CODE1<0:N> and the second codes CODE2<0:N> at a periodic cycle during the operation of the integrated circuit.

As described above, an amplifier type buffer is applied with the same voltage through differential input terminals, and the output signal of the amplifier type buffer is buffered by an inverter type buffer. Further, depending upon the output signal of the inverter type buffer, an amount of current to be supplied to the amplifier type buffer or to be sunken from the amplifier type buffer is controlled. Accordingly, the logic value of a signal inputted from an outside of a chip and the logic value of a signal recognized inside the chip may accurately correspond to each other.

While the present invention has been described with respect to the specific embodiments, it will be apparent to those skilled in the art that various changes and modifications may be made without departing from the spirit and scope of the invention as defined in the following claims.

What is claimed is:

1. A buffer control circuit comprising:
   a current supply unit configured to supply current and adjust the current in response to codes;
   a first buffer configured to receive the current and output a value obtained by comparing a reference potential received at one input node to the reference potential received at another input node;
   a second buffer configured to buffer an output of the first buffer; and
   a code generation unit configured to generate the codes in response to an output of the second buffer.

2. The buffer control circuit of claim 1, wherein the code generation unit is configured to generate the codes such that the current decreases when the output of the second buffer has a logic high level and increases when the output of the inverter type buffer has a logic low level.

3. The buffer control circuit of claim 1, wherein the code generation unit is configured to:
discriminate the output of the second buffer;
control a value of the codes such that the current decreases when the output of the second buffer has a logic high level and increases when the output of the second buffer has a logic low level; and
lock the value of the codes when the output of the second buffer transitions.

4. The buffer control circuit of claim 3, wherein the code generation unit is configured to repeat the controlling of the value of the codes until the output of the second buffer transitions.

5. The buffer control circuit of claim 1, wherein the code generation unit comprises:
an up/down counter configured to increase or decrease the value of the codes in response to the output of the inverter type buffer.

6. The buffer control circuit of claim 5, wherein the code generation unit further comprises:
a transition detecting section configured to activate a stop signal when the output of the second buffer transitions,
wherein, when the stop signal is activated, an operation of the up/down counter is stopped.

7. The buffer control circuit of claim 1, wherein the first buffer comprises a P-type differential amplifier.

8. A buffer control circuit comprising:
a first buffer configured to output a value obtained by comparing a reference potential received at one input node to the reference potential received at another input node;
a current sinking unit configured to sink current and adjust the current in response to codes;
a second buffer configured to buffer an output of the first buffer; and
a code generation unit configured to generate the codes in response to an output of the second buffer.

9. The buffer control circuit of claim 8, wherein the code generation unit is configured to generate the codes such that the current increases when the output of the second buffer has a logic high level and decreases when the output of the second buffer has a logic low level.

10. The buffer control circuit of claim 8, wherein the code generation unit is configured to:
discriminate the output of the inverter type buffer;
control a value of the codes such that the current increases when the output of the second buffer has a logic high level and decreases when the output of the second buffer has a logic low level; and
lock the value of the codes when the output of the second buffer transitions.

11. The buffer control circuit of claim 10, wherein the code generation unit is configured to repeat the controlling of the value of the codes until the output of the second buffer transitions.

12. The buffer control circuit of claim 8, wherein the code generation unit comprises:
an up/down counter configured to increase or decrease the value of the codes in response to the output of the second buffer.

13. The buffer control circuit of claim 12, wherein the code generation unit further comprises:
a transition detecting section configured to activate a stop signal when the output of the second buffer transitions,
wherein, when the stop signal is activated, an operation of the up/down counter is stopped.

14. The buffer control circuit of claim 8, wherein the first buffer comprises an N-type differential amplifier.

15. A buffer control circuit comprising:
a current supply unit configured to supply a supply current and adjust the supply current in response to first codes;
a first amplifying buffer configured to receive the supply current and drive an output node by comparing received at one input node a reference potential to the reference potential received at another input node;
a second amplifying buffer configured to drive the output node by comparing the reference potential received at one input node to the reference potential received at another input node;
a current sinking unit configured to sink a sinking current and adjust the sinking current in response to second codes;
an additional buffer configured to buffer a signal outputted from the output node; and
a code generation unit configured to generate the first codes and the second codes in response to an output of the additional buffer.

16. The buffer control circuit of claim 15, wherein the code generation unit is configured to generate the first codes and the second codes such that the sinking current increases relative to the supply current when the output of the additional buffer has a logic high level and the supply current increases relative to the sinking current when the output of the additional buffer has a logic low level.

17. The buffer control circuit of claim 16, wherein the code generation unit is configured to:
discriminate the output of the additional buffer;
control a value of the second codes such that the sinking current increases when the output of the additional buffer has a logic high level and increases when the output of the additional buffer has a logic low level; and
locking the values of the first codes and the second codes when the output of the additional buffer transitions.

18. The buffer control circuit of claim 17, wherein the code generation unit is configured to repeat the controlling of the values of the first and second codes until the output of the additional buffer transitions.

19. The buffer control circuit of claim 15, wherein the code generation unit comprises:
a down counter configured to decrease the value of the first codes in response to the output of the additional buffer; and
an up counter configured to increase the value of the second codes in response to the output of the additional buffer.

20. The buffer control circuit of claim 19, wherein the code generation unit further comprises:
a transition detecting section configured to activate a stop signal when the output of the additional buffer transitions,
wherein, when the stop signal is activated, operations of the down counter and the up counter are stopped.

21. The buffer control circuit of claim 15, wherein the first amplifying buffer comprises a P-type differential amplifier and the second amplifying buffer comprises an N-type differential amplifier.

22. An integrated circuit comprising:
a replica current supply unit configured to supply current and adjust the current in response to codes;
a replica amplifying buffer configured to receive the current supplied from the replica current supply unit and output a value obtained by comparing a reference poten tial received at one input node to the reference potential received at another input node;
an additional buffer configured to buffer an output of the replica amplifying buffer;
a code generation unit configured to generate the codes in response to an output of the additional buffer;
at least one input pad;
at least one current supply unit configured to supply current in response to the codes; and
at least one amplifying buffer configured to receive the current supplied from the current supply unit and compare a signal inputted to the at least one input pad and the reference potential.

23. The integrated circuit of claim 22, wherein the at least one input pad, at least one supply unit, at least one amplifying buffer comprise a plurality of input pads, a plurality of current supply units and a plurality of amplifying buffers, respectively.

24. An integrated circuit comprising:
a replica amplifying buffer configured to compare a reference potential received at one input node to the reference potential received at another input node;
a replica current sinking unit configured to sink a current and adjust the current in response to codes;
a replica additional buffer configured to buffer an output of the replica amplifying buffer;
a code generation unit configured to generate the codes in response to an output of the replica additional buffer;
at least one input pad;
at least one amplifying buffer configured to compare a signal inputted to the at least one input pad and the reference potential; and
at least one current sinking unit configured to sink current from the at least one amplifying buffer in response to the codes.

25. The integrated circuit of claim 24, wherein the at least one input pad, at least one supply unit, at least one amplifying buffer, and at least one current sinking unit comprise a plurality of input pads, a plurality of amplifying buffers and a plurality of current sinking units, respectively.

26. An integrated circuit comprising:
a replica current supply unit configured to supply a supply current and adjust the supply current in response to first codes;
a first replica amplifying buffer configured to receive the supply current supplied from the replica current supply unit and drive an output node by comparing a reference potential received at one input node to the reference potential at another input node;
a second replica amplifying buffer configured to drive the output node by comparing the reference potential received at one input node to the reference potential received at another input node;
a replica current sinking unit configured to sink a sinking current and adjust the sink current in response to second codes;
a replica additional buffer configured to buffer a signal outputted from the output node;
a code generation unit configured to generate the first codes and the second codes in response to an output of the replica additional buffer;
at least one input pad;
at least one current supply unit configured to supply current in response to the first codes;
at least one first amplifying buffer configured to receive the current supplied from the at least one current supply unit and drive an output node by comparing a signal inputted to the at least one input pad and the reference potential;
at least one second amplifying buffer configured to drive the output node by comparing the signal inputted to the at least one input pad and the reference potential; and
at least one current sinking unit configured to sink current from the at least one second amplifying buffer in response to the second codes.

27. The integrated circuit of claim 26, wherein the at least one input pad, at least one current supply unit, at least one first amplifying buffer, at least one second amplifying buffer, and at least one current sinking unit comprise a plurality of input pads, a plurality of current supply units, a plurality of first amplifying buffers, a plurality of second amplifying buffers and a plurality of current sinking units, respectively.

* * * * *